United States Patent
Sekijima et al.

(10) Patent No.: US 7,071,687 B2
(45) Date of Patent: Jul. 4, 2006

(54) PHOTOMAGNETIC FIELD SENSOR

(75) Inventors: Takenori Sekijima, Kusatsu (JP); Mikio Geho, Otsu (JP); Takashi Fujii, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 234 days.

(21) Appl. No.: 10/642,275

(22) Filed: Aug. 18, 2003

(65) Prior Publication Data

US 2004/0056655 A1     Mar. 25, 2004

(30) Foreign Application Priority Data

Sep. 20, 2002   (JP) .............................. 2002-275989

(51) Int. Cl.
*G01R 33/02*    (2006.01)
(52) U.S. Cl. .................................. 324/244.1; 359/280
(58) Field of Classification Search ............. 324/244.1, 324/244; 359/280, 281, 283
See application file for complete search history.

(56) References Cited

U.S. PATENT DOCUMENTS

| | | | |
|---|---|---|---|
| 3,368,861 A * | 2/1968 | Rubinstein et al. ......... 359/283 |
| 3,420,601 A * | 1/1969 | Graf et al. .................. 359/282 |
| 3,484,152 A * | 12/1969 | Robinson .................... 359/282 |
| 3,827,036 A * | 7/1974 | O'Donnell et al. ........... 365/37 |
| 4,222,668 A * | 9/1980 | Henry ........................ 356/472 |
| 4,563,236 A * | 1/1986 | Ross et al. .................. 324/205 |
| 4,608,535 A * | 8/1986 | Tada et al. ............... 324/244.1 |
| 4,843,232 A * | 6/1989 | Emo et al. ................... 250/225 |
| 4,896,103 A * | 1/1990 | Shimanuki et al. ........... 324/96 |
| 5,245,689 A * | 9/1993 | Gualtieri .................... 385/142 |
| 5,483,161 A * | 1/1996 | Deeter et al. ............. 324/244.1 |
| 5,493,222 A * | 2/1996 | Shirai et al. .............. 324/244.1 |
| 5,493,984 A | 2/1996 | Miyazawa et al. |
| 5,861,741 A * | 1/1999 | Itoh ............................ 324/96 |
| 5,969,517 A * | 10/1999 | Rao ............................. 324/96 |
| 6,108,120 A * | 8/2000 | Kawai et al. ................ 359/283 |
| 6,392,784 B1 * | 5/2002 | Ikeda et al. .................. 359/282 |
| 6,678,433 B1 * | 1/2004 | Kim et al. ..................... 385/15 |
| 6,717,713 B1 * | 4/2004 | Onaka et al. ................ 359/281 |
| 6,833,694 B1 * | 12/2004 | Ikekame ....................... 324/96 |
| 2003/0210451 A1 * | 11/2003 | Onaka et al. ................ 359/281 |
| 2005/0145868 A1 * | 7/2005 | Kummer et al. .............. 257/98 |

FOREIGN PATENT DOCUMENTS

| | | | |
|---|---|---|---|
| EP | 001095998 A2 * | 5/2001 | .......... 257/E33.061 |
| JP | 5-072307 | 3/1993 | |
| JP | 07-010694 | 1/1995 | |
| JP | 2001-208818 | 8/2001 | |
| JP | 2001-226196 | 8/2001 | |

OTHER PUBLICATIONS

M.J. Weber et al., Rare Earth Faraday Rotator Materials for Lasers, abstract therefor, published by Elsevier Sequoia, Journal of the Less Common Metals, 93 (1983), pp. 276-277.*

Official Communication dated Jan. 18, 2006, issued in the corresponding Japanese Patent Application No. 2002-275989.

* cited by examiner

*Primary Examiner*—Bot Ledynh
*Assistant Examiner*—Kenneth J. Whittington
(74) *Attorney, Agent, or Firm*—Keating & Bennett, LLP

(57) ABSTRACT

A photo magnetic field sensor includes a Faraday rotator made of a paramagnetic material, a polarizer, an analyzer, a light-irradiating element, and a light-sensing element. The Faraday rotator is made of a paramagnetic garnet single crystal including at least Tb and Al.

16 Claims, 10 Drawing Sheets

PHOTOMAGNETIC FIELD SENSOR

BACKGROUND OF THE INVENTION

Field of the Invention

Recently, photo magnetic field sensors using magneto-optical materials have been very attractive in the electric power fields for use as sensors for detecting abnormal currents flowing in electric energy transmission lines which may be caused by lightning or other occurrence. A photo magnetic sensor detects a magnetic field generated around an electric energy transmission line using the Faraday effect which is a magneto-optical effect. That is, the photo magnetic sensor functions using the change of a Faraday rotational angle of the Faraday rotator which depends on the strength of a magnetic field. This will be more specifically described. As generally known, when a laser beam is irradiated to a Faraday rotator having the Faraday effect so that a magnetic field is generated in the propagation direction of the laser beam, the polarization plane of the incident laser beam is rotated in proportion to the strength of the magnetic field. Based on this effect, polarizer having different polarization planes are arranged along the propagation direction of a laser beam and before and after the Faraday rotator. Thus, a difference is caused between the light-quantity of the laser beam incident on the Faraday rotator passed through one of the polarizer and the light-quantity of the laser beam passed through the Faraday rotator and emerging from the other polarizer. The intensity of an abnormal current can be determined by detection of the difference between the light-quantities by means of a light-sensing element.

The sensitivity of the photo magnetic sensor using the Faraday effect as described above is high. The photo magnetic field sensor can be reduced in size and weight. In addition, the explosion-proofing property is excellent since light is used as a medium. The sensor can be remote-controlled. Moreover, the photo magnetic field sensor, which uses optical fibers for propagation of a light, is superior in prevention of electromagnetic induction, anti-noise property, and insulating property. Thus, the photo magnetic field sensor has such superior properties that can not be rendered by an electricity-type magnetic sensor.

Referring to the properties of a magnetic material which forms the Faraday rotator for use in a photo magnetic sensor, it is necessary for the magnetic material to have a high Verder constant (V: (deg/(Oe·cm)). The Verdet constant means a Faraday rotational angle per unit length of the rotator and unit magnetic field applied thereto. The Verdet constant is expressed by formula of $\theta = VHd$ in which $\theta$ is a Faraday rotational angle, i.e., the rational angle of a polarized light, d is a movement distance of the light transmitted through the Faraday rotator, and H is the strength of a magnetic field applied to the Faraday rotator. As seen in this formula, the larger the Verdet constant is, the larger the Faraday rotational angle is. As a result, the change-ratio of the Faraday rotational angle is increased with the change of the magnetic field strength. The difference between the light quantities of the incident and emerging light of the laser beam becomes large. Thus, a photo magnetic sensor having a higher sensitivity can be provided.

As a magnetic material which provides the above-described properties, a single crystal of yttrium iron garnet ($Y_3Fe_5O_{12}$: hereinafter, referred to as YIG briefly) which is a ferromagnetic material has been used as described in a Japanese Unexamined Patent Application Publication No. 5-72307, pages 3 and 4). The Verdet constant of the YIG single crystal is high, i.e., $1.5 \times 10^{-1}$ deg/(Oem). Thus, advantageously, this single crystal can realize the production of a photo magnetic sensor with a high sensitivity.

However, the YIG single crystal described in Japanese Unexamined Patent Application Publication No. 5-72307 has a problem in that the Faraday rotational angle becomes magnetically saturated, and in particular, the Faraday rotational angle is increased in the magnetic field strength range of up to a predetermined value, and becomes constant in the range exceeding the predetermined value. Therefore, a photo magnetic field sensor for detecting a large current, which uses the YIG single crystal as the Faraday rotator, has a problem in that the current can not be correctly detected. Moreover, through the YIG single crystal, only a light having a wave-length in the infrared ray region of 1100 nm to 5000 nm can be transmitted. Thus, plastic fibers which are applicable in the visible light region of 500 nm to 650 nm can not be used for the photo magnetic field sensor. Thus, problematically, the production cost of the magnetic field sensor is high.

SUMMARY OF THE INVENTION

In order to overcome the problems described above, preferred embodiments of the present invention provide a photo magnetic field sensor which exhibits a high sensitivity even when a large current flows, i.e., the magnetic field strength is high, and senses a magnetic field by using a light with a wavelength in the visible light region of about 500 nm to about 650 nm.

According to a preferred embodiment of the present invention, a photo magnetic field sensor includes a Faraday rotator formed of a paramagnetic material, a polarizer, an analyzer, a light-irradiating element, and a light-sensing element, the Faraday rotator being made of a paramagnetic material being made of a paramagnetic garnet single crystal including at least Tb and Al.

The inventors of the present invention have discovered that a terbium-aluminum type paramagnetic garnet including Tb and Al ($Tb_3Al_5O_{12}$; hereinafter, referred to as TAG briefly) is suitable for use as a Faraday rotator which has a high Verdet constant, of which the Faraday rotational angle is prevented from being saturated, and through which a light having a wavelength in a visible light region of about 500 nm to about 650 nm can be transmitted, and has realized the use of the TAG single crystal as the Faraday rotator of a photo magnetic field sensor. More specifically, the TAG single crystal is a decomposition-melting type compound. Thus, the TAG single crystal composed of a garnet phase can not be produced directly from the molten composition of a starting material. That is, a problem is caused in that $TbAlO_3$ composed of a perovskite phase is incorporated in the TAG single crystal. However, as a result of the intensive investigation by the inventors of the present application, they have succeeded in producing a TAG single crystal suitable for use in a photo magnetic field sensor by applying a strong light energy to a molten phase using a $CO_2$ gas laser. When a photo magnetic field sensor including a Faraday rotator formed of the TAG single crystal is used, the Faraday rotational angle is prevented from being saturated, the sensitivity is high even when a large current flows, and moreover, a magnetic field can be sensed by use of a light having a wavelength in a visible light region of about 500 nm to about 650 nm.

Preferably, the photo magnetic field sensor includes a Faraday rotator made of a paramagnetic material, a polarizer, an analyzer, a light-irradiating element, and a light-sensing element, the Faraday rotator formed of a paramagnetic material having a columnar shape in which the diameter A (mm) of the column of the Faraday rotator and the distance B (mm) between one end of the Faraday rotator and the other end thereof satisfy the formulae of $0<A\leq 2$ and $1\leq B/A\leq 10$. When the Faraday rotator having the above-described shape is used, the length between one end of the Faraday rotator and the other end thereof, i.e., the movement distance of a light which is transmitted through the Faraday rotator is large. Accordingly, the Faraday rotational angle of the Faraday rotator can be increased, and thereby, the sensitivity of the photo magnetic field sensor is further improved. In addition, in the Faraday rotator of which the distance between one end and the other end is large, the demagnetizing field in the Faraday rotator can be reduced. In particular, the Faraday rotator is preferably made of a magnetic material. When a magnetic field is externally applied to the Faraday rotator, a magnetic field (demagnetizing field) is generated in the direction reverse to that of the external magnetic field. Practically, the magnetic field component that is substantially equal to the difference between the external magnetic field and the demagnetizing field is detected. That is, problematically, the sensitivity is deteriorated. Thus, according to preferred embodiments of the present invention, affects of the demagnetizing field, which occurs in the Faraday rotator, can be suppressed by increasing the distance between one end of the Faraday rotator and the other end thereof.

Preferably, the Faraday rotator of the photo magnetic field sensor is preferably made of a paramagnetic garnet single crystal including at least Tb, Al, and one or both of Ce and Pr. When this Faraday rotator is used, the Verdet constant is even more increased, so that the Faraday rotational angle can be further increased. As a result, a photo magnetic field sensor having a high sensitivity can be provided.

Other features, elements, characteristics and advantages of the present invention will become more apparent from the following detailed description of preferred embodiments thereof with reference to the attached figures.

DETAILED DESCRIPTION OF PREFERRED EMBODIMENTS

Figure 1:
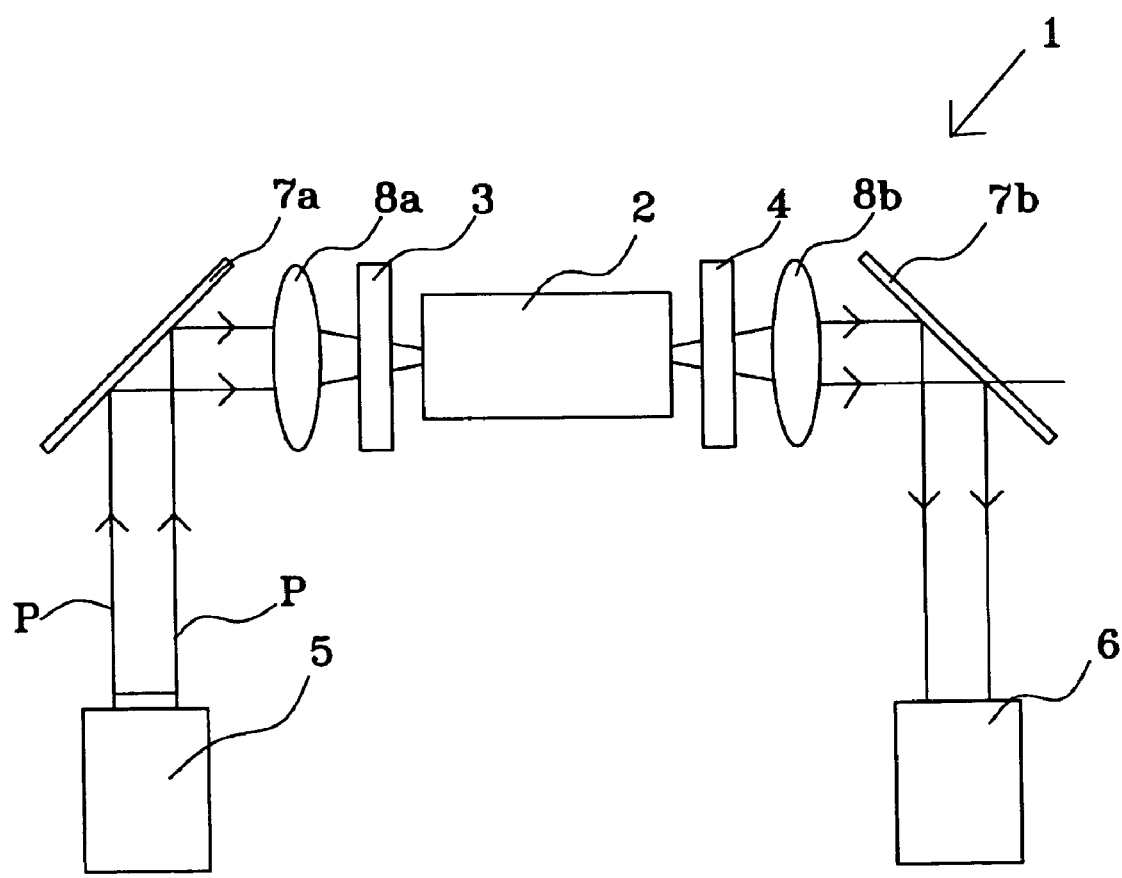
FIG. 1 schematically illustrates the configuration of a photo magnetic field sensor according to a preferred embodiment of the present invention.

Hereinafter, a preferred embodiment of the present invention will be described with reference to FIG. 1. It should be noted that the term "optical axis" has a general meaning indicating a propagation path of a light. Moreover, the term "incidence of a light" means that the light, irradiated from a light source, falls on the photo magnetic field sensor. The term "emergence of a light" means that the light emerges from the photo magnetic field sensor. FIG. 1 is a schematic view of the configuration of the photo magnetic field sensor according to a preferred embodiment of the present invention. The photo magnetic field sensor 1 preferably includes a Faraday rotator 2, a polarizer 3, an analyzer 4, a light-irradiating element 5, and a light-sensing element 6.

In particular, the polarizer 3 is provided on the incidence side of the Faraday rotator 2. The analyzer 4 is arranged on the emergence side of the Faraday rotator 2 and along the optical axis substantially parallel to the Faraday rotator 2. The polarizer 3 and the analyzer 4 are arranged such that the optical axis extended through the Faraday rotator 2 passes through the polarization planes of the polarizer 3 and the analyzer 4, and the respective polarization planes are vertical to the optical axis. The light-irradiating element 5 is arranged such that a light can be made to fall on the polarizer 3. In particular, the light-irradiating element 5 is not necessarily disposed along the optical axis passed through the Faraday rotator 2. An optical path may be changed. For example, a total reflecting mirror 7a may be provided between the light-irradiating element 5 and the polarizer 3, so that a light is reflected. Thus, the size of the photo magnetic field sensor 1 can be reduced by providing the total reflecting mirror 7a between the light-irradiating element 5 and the polarizer 3. Moreover, a total reflecting mirror 7b may be provided between the analyzer 4 and the light-sensing element 6 for the same reason with respect to the total reflecting mirror 7a which is provided between the light-irradiating element 5 and the polarizer 3. Furthermore, collective lenses 8a and 8b can be provided between the total reflecting mirror 7a and the polarizer 3 and between the total reflecting mirror 7b and the analyzer 4, respectively. The collective lens 8a, provided as described above, can cause the light to efficiently fall on the Faraday rotator 2. Moreover, the collective lens 8b, provided as described above, can cause the light to be efficiently fed to the light-sensing element 6.

The Faraday rotator 2 used here is preferably formed of a terbium-aluminum type paramagnetic garnet single crystal containing at least Tb and Al. Specifically, $Tb_3Al_5O_{12}$ or $Tb_3Al_5O_{12}$ of which a Tb site is substituted by a rare earth element such as Ce, Pr, Dy, Ho, Er, and Tm may be used. $Tb_3Al_5O_{12}$ is preferable from the standpoint of a high Verdet constant and an appropriate light transmittance in a visible light region of about 400 nm to about 650 nm. The TAG single crystal of which a Tb site is substituted by at least one of Ce and Pr is more preferable. It has been found that the Verdet constant of the TAG single crystal is high, since an absorption end, which contributes to the increased Faraday effect, exists in the near ultraviolet light region. Thereby, the Faraday rotational angle becomes large, and hence, the sensitivity of the photo magnetic field sensor 1 is greatly improved.

Referring to the shape and size of the Faraday rotator 2, rod-, thin-sheet-, and thin-film shapes can be used. A columnar shape is preferable. The obtained single crystal, having a columnar shape, can be easily processed. Moreover, a magnetic field, derived from a current, tends to be uniformly applied to the inside of the Farady rotator 2.

Moreover, the size of the Faraday rotator 2 may be set, based on the type of an objective sensor and the Verdet constant of a TAG type single crystal which constitutes the Faraday rotator 2. Preferably, the diameter A (mm) of the column of the Faraday rotator 2 and the distance B (mm) between one end of the Faraday rotator 2 and the other end thereof satisfy the formulae of $0<A\leq2$ and $1\leq B/A\leq10$. It should be noted that the ends of the Faraday rotator 2 are defined as the surfaces thereof that are substantially perpendicular to the optical axis which a light falls on and emerges from, respectively. According to this configuration, the Faraday rotational angle can be increased, and hence, the sensitivity of the photo magnetic field sensor 1 can be greatly improved. If the diameter A exceeds 2, a problem will be caused in that an external magnetic field is not uniformly applied to the inside of the Faraday rotator 2. Moreover, if the ratio B/A is less than 1, undesirably, the demagnetizing field is increased because of the small distance between the one end of the Faraday rotator and the other end thereof. Furthermore, if the ratio B/A exceeds 10, undesirably, the light transmittance is reduced because of the large distance over which a light moves through the Faraday rotator 2.

Figure 3:
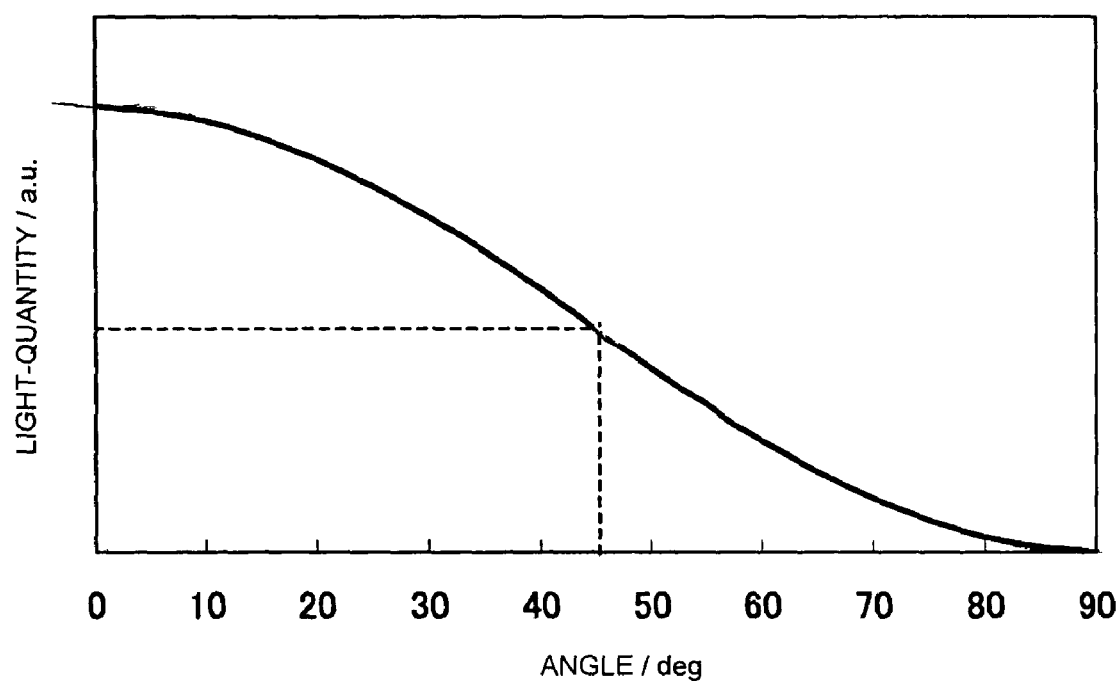
FIG. 3 is a graph showing a relationship between the angle of the polarizer to the analyzer and the quantity of light passed through the polarizer and the analyzer.

The planes of incidence and emergence of the polarizer 3 and the analyzer 4 are substantially perpendicular to the optical axis passed through the Faraday rotator 2. The polarizer 3 and the analyzer 4 are disposed before and after the Faraday rotator 2, respectively, and preferably, are arranged in such a manner that the polarization plane of the polarizer 3 has an angle of about 45° relative to that of the analyzer 4. This relationship between the polarizer 3 and the analyzer 4 will be described with reference to FIG. 3. In FIG. 3, the angle between the polarization planes of the polarizer 3 and the analyzer 4 is plotted as abscissa. The quantity of a light emerging from the analyzer 4 is plotted as ordinate. A tangential line is drawn on the curve at each angle. The slope of each tangential line represents the transmittance of the light-quantity. As seen in FIG. 3, the variation of a magnetic field can be most efficiently converted to the light quantity which can be transmitted at an angle of about 45°. A stretched-oriented polymer or a single crystal polarizer formed of rutile, calcite ($CaCO_3$), or other suitable material can be used as the polarizer 3 and the analyzer 4. Moreover, a plurality of metallic thin wires arranged substantially parallel to each other in a predetermined direction to have a sheet-shape may be used.

As the light-irradiating element 5, a ruby laser, an He—Ne laser, an Ar laser, an He—Cd laser, an InGaN semiconductor laser, or other suitable material may be used. However, the light-irradiating element 5 is not limited onto these lasers. Of these lasers, the He—Ne laser, of which the wavelength is about 633 nm, can operate in the visible light region. Also, since the wavelength is near the wavelength region of a plastic fiber, the He—Ne laser can be preferably used. Preferably, a photodetector is used as the light-sensing element 6. In addition, a receiving optics formed of Si, InGaAs, or other suitable material may be used. These devices are not restrictive.

Preferably, the reflection plane of each of the total reflecting mirrors 7a and 7b is arranged at an angle of about 45° relative to an incident light and also to the optical axis of the Faraday rotator 2. With this configuration, any incident light is propagated toward the center of the Faraday rotator 2, even if the light source is not arranged along the optical axis of the Faraday rotator 2. Thus, the strength of a magnetic field can be more correctly sensed. Preferably, the total reflecting mirrors 7a and 7b are formed of Al, Au, or other suitable material. Especially, Al is preferable. Al is a material having a highest reflectivity for a visible light, and hence, can reduce the loss of light energy as much as possible.

Moreover, the collective lens 8a is arranged in such a manner that the beam waist is passed through the center of the Faraday rotator 2. With this arrangement, a light can fall on the Faraday rotator 2 most efficiently. As the collective lenses 8a and 8b, bi-convex lenses, ball lenses, and other such devices can be used. However, these lenses are not restrictive.

Hereinafter, the function of the photo magnetic field sensor will be described, assuming that an impeller is arranged which has a permanent magnet attached thereto to generate a magnetic field on the side of the Faraday rotator, and the magnetic field is applied substantially parallel to the optical axis of the Faraday rotator. First, a light, irradiated from the light-irradiating element 5, is reflected from the total reflecting mirror 7a to be deflected by an angle of about 90°, so that the reflected light becomes substantially parallel to the optical axis passing the Faraday rotator 2. The reflected light is collected by the collective lens 8a. Then, the light, passed through the polarizer 3 to have the polarization plane as the polarizer 3, falls on the Faraday rotator 2. In this case, a magnetic field is applied substantially parallel to the optical axis passing the center of the Faraday rotator 2. Thereby, the polarization plane of the light entering the Faraday rotator 2 is rotated with respect to the propagation direction of the light in the Faraday rotator 2 by an angle substantially equal to the Faraday rotational angle, due to the Faraday effect. Of the light which has emerged from the Faraday rotator 2, only the portion thereof that has the same polarization plane as the analyzer 4 is passed through the analyzer 4 to emerge from the analyzer 4. The light, which has emerged from the analyzer 4, is increased in width, and is passed through the collective lens 8a. Then, the light is reflected on the total reflecting mirror 7b to deflect by an angle of about 90° relative to the optical axis. The quantity of the reflected light is sensed by the light-sensing element 6.

Figure 2:
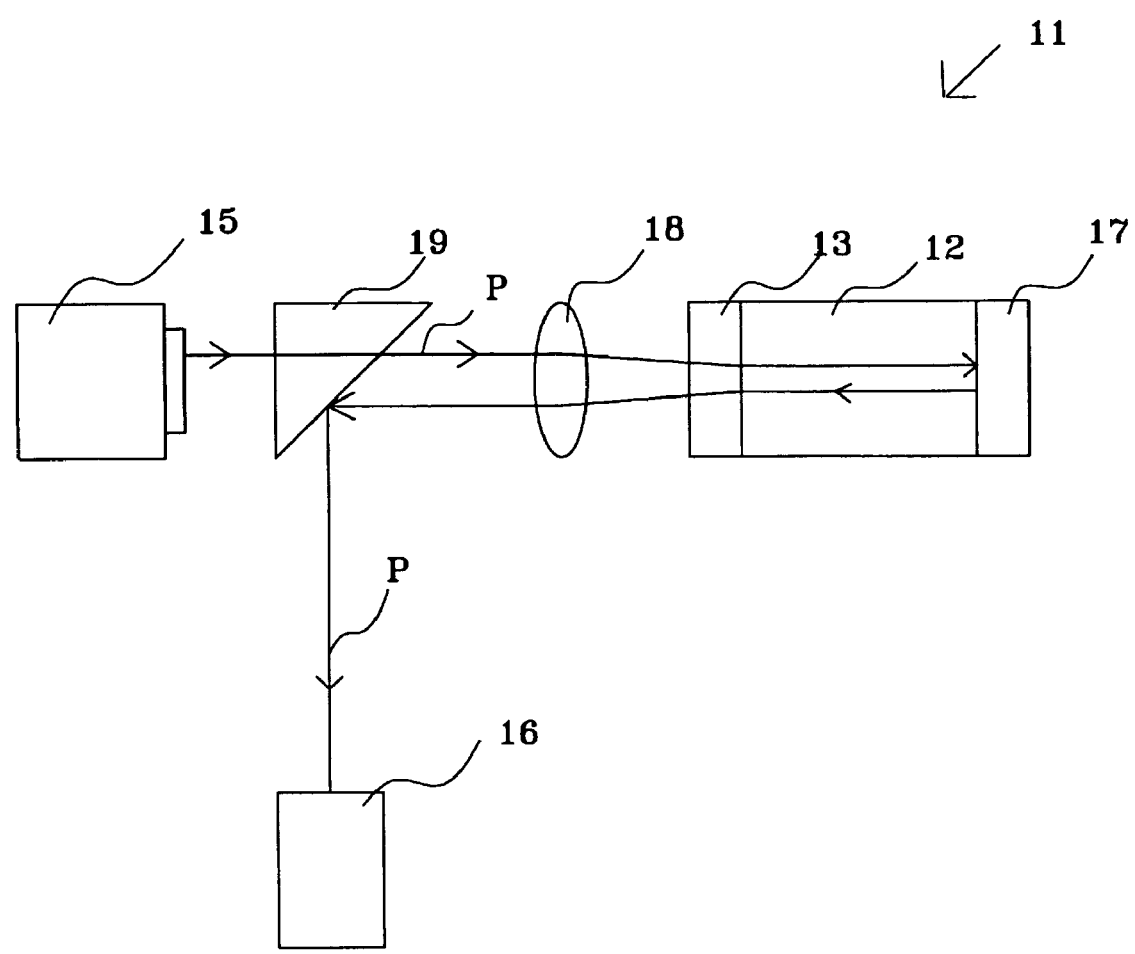
FIG. 2 schematically illustrates the configuration of a photo magnetic field sensor according to another preferred embodiment of the present invention.

Hereinafter, another preferred embodiment of the present invention will be descried with reference to FIG. 2. FIG. 2 schematically illustrates the configuration of a photo magnetic field sensor according to another preferred embodiment of the present invention. The photo magnetic field sensor 11 includes a Faraday rotator 12, a polarizer 13, a light-irradiating element 15, a light-sensing element 16, a total reflecting mirror 17, a collective lens 18, and a polarizing prism 19. In this preferred embodiment, the polarizer 13 is provided on one end surface of the Faraday rotator 12 which is on the incidence side of the Faraday rotator 12. The total reflecting mirror 17 is formed, preferably by vapor deposition, on the other end surface of the Faraday rotator 12. The polarizing prism 19 and the collective lens 18 are arranged along the optical axis between the light-irradiating element 15 and the Faraday rotator 12. According to this configuration, the number of components of the photo magnetic field sensor can be reduced compared to that of the preferred embodiment shown in FIG. 1. Thus, the photo magnetic field sensor 11 having a smaller size can be provided.

In this preferred embodiment, the Faraday rotator 12, the polarizer 13, the total reflecting mirror 17, and the collective lens 18 may be the same as those of the preferred embodiment shown in FIG. 1. The polarizing prism 19 is arranged in such a manner that a light incident on the polarizing prism 19 is rectilinearly propagated, while the light reflected from the total reflecting mirror 17 is reflected from the polarizing prism 19 at a right angle to the incident light on the polarizing prism 19. With this arrangement, the light incident on the polarizing prism 19 can be separated from the light reflected from the total reflecting mirror 17 and incident on the polarizing prism 19. Therefore, the light quantity can be correctly determined. As the polarizing prism 19, calcite or other suitable material may be used.

Hereinafter, the function of the photo magnetic field sensor 11 according to the present preferred embodiment of the present invention, shown in FIG. 2, will be described. In this case, it is assumed that an impeller having a permanent magnet for generating a magnetic field on the side of the Faraday rotator is arranged, and the magnetic field is applied substantially parallel to the optical axis of the Faraday rotator. In this case, a light irradiated from light-irradiating element 15 is passed through the polarizing prism 19 substantially parallel to the optical axis. The light passed through the polarizing prism 19 is collected via the collective lens 18, and falls on the Faraday rotator 12 having the polarizer 13 provided therewith. In this case, the light having the same polarization plane as the polarizer 13 is passed through the polarizer 13, and the polarization plane is rotated by an angle equal to the Faraday rotational angle in the Faraday rotator 12. The light having the rotated polarization plane is reflected from the total reflecting mirror 17 which is formed on the other end surface of the Faraday rotator 12, by an angle of about 180° to the incident light on the total reflecting mirror 17. Then, the reflected light is transmitted through the Faraday rotator 2 again. In this case, the magnetic field is applied to the light reflected from the total reflecting mirror 17 in the direction reverse to that of the magnetic field applied to the light transmitted there from the incidence side, and also, the anti-reciprocity of the Faraday effect is applied so that the polarization plane is rotated by an angle equal to the Faraday rotational angle with respect to the optical axis of the light transmitted there from the incidence side. Then, the reflection light having the same polarization plane of the polarizer 13 emerges from the polarizer 13. The beam-width of the light which has emerged from the polarizer 13 is increased and passed through the collective lens 18 again. Then, the light becomes a rectilinear light and falls on the polarizing prism 19. The light incident on the polarizing prism 19 is reflected in the direction that is substantially perpendicular to the optical axis. Then, the light-quantity is detected by the light-sensing element 16.

EXAMPLE 1

Hereinafter, a preferred embodiment of the present invention will be more specifically described.

1. Preparation of TAG Single Crystal

First, $Tb_4O_7$ (purity; 99.9%) and $Al_2O_3$ (purity; 99.99%) are prepared as starting materials for a paramagnetic garnet polycrystal, and are weighed out to form $Tb_3Al_5O_{12}$. The mixing amounts and the composition may be changed, depending on a required Verdet constant. Then, refined water is added to the mixed powder of the prepared starting materials and mixed together with balls for about 24 hours. After water is removed from the mixed powder, the powder is dried by a drier. The dried power is sieved through a mesh sieve for adjustment of the grain size of the mixed powder and calcinated at about 1200° C. for approximately 2 hours in an electric furnace. After the calcinated mixed powder is crushed, an organic binder and a solvent are added to the mixed powder and mixed together with balls for several hours. Thus, a slurry-like mixture is obtained. The mixture is formed into a columnar shape by a molding machine and then, fired at about 1600° C. for approximately 2 hours in an electric furnace. Thus, a columnar TAG polycrystal is obtained. Then, the columnar TAG polycrystal and a TAG single crystal as a seed crystal are prepared and set in a $CO_2$ laser FZ (floating zone) apparatus. A $CO_2$ laser beam is irradiated in an atmospheric ambience to heat and melt the end-portion of the TAG polycrystal. Then, the end-portion of the TAG polycrystal and the end-portion of the seed crystal are joined to each other. Subsequently, a $CO_2$ laser beam is irradiated to the joint portion of the end-portions of the TAG polycrystal and the seed crystal, and also, the TAG polycrystal is further heated to be melted. The produced molten material is cooled to produce a TAG single crystal.

2. Preparation of Photo Magnetic Field Sensor

The Faraday rotator prepared as described above is processed to form a column having a length of about 1 mm and a diameter in cross-section of about 1 mm. The ratio (B/A) of the length (B) between both of the ends of the Faraday rotator based on the diameter (A) thereof is 1. A polarizer and an analyzer each formed of rutile, and two collective lenses formed of synthetic quartz are prepared. The collective lens, the polarizer, the Faraday rotator, the analyzer, and the collective lens are arranged along the optical axis in that order from the incidence side of a light. Total reflecting lenses are provided between the light-irradiating element and the collective lens and between a photodetector as the light-sensing element and the collective lens, respectively. The light-irradiating element is positioned in such a manner that a light irradiated from the light-irradiating element is reflected from the total reflecting mirror by an angle of about 90° relative to the incident light, and becomes substantially parallel to the Faraday rotator. The light-sensing element is arranged so as to detect the light which is passed through the Faraday rotator and reflected from the total reflecting mirror by an angle of about 90° relative to the incident light on the mirror. Thus, a photo magnetic field sensor having the configuration shown in FIG. 1 is formed, and is taken as Example 1.

In addition to the photo magnetic field sensor of Example 1 having the above-described configuration, the following photo magnetic field sensors of Examples 2 and 3 and Comparative Examples 1 to 3 are prepared.

EXAMPLE 2

A photo magnetic field sensor having the same constitution as that of Example 1 except that a TAG type single crystal having formula of $(Tb_{2.8}Ce_{0.2})Al_5O_{12}$ is used for the Faraday rotator is produced, and is taken as Example 2 (it should be noted that a TAG type single crystal having a portion of the Tb substituted by Ce is suitable for use in a visible light region of about 525 nm to about 680 nm).

EXAMPLE 3

A photo magnetic field sensor having the same constitution as that of Example 1 except that a TAG type single crystal having formula of $(Tb_{2.8}Pr_{0.2})Al_5O_{12}$ is used for the Faraday rotator is produced, and is taken as Example 3.

Comparative Example 1

A photo magnetic field sensor having the same constitution as Example 1 except that a single crystal having formula of $Y_3Fe_5O_{12}$ is used for the Faraday rotator is produced, and is taken as Comparative Example 1.

Comparative Example 2

A photo magnetic field sensor having the same constitution as Example 1 except that a Faraday glass is used for the Faraday rotator is produced, and is taken as Comparative Example 2.

Comparative Example 3

A photo magnetic field sensor having the same constitution as Example 1 except that a single crystal having formula of $Bi_{12}GeO_{20}$ is used for the Faraday rotator is produced, and is taken as Comparative Example 3.

The characteristics of the photo magnetic field sensors of Examples 1 to 3 and Comparative Examples of 1 to 3 produced as described above are evaluated as follows.

First, the Verdet constants of the Faraday rotators of Examples 1 to 3 and Comparative Examples 1 to 3 are measured. While a magnetic field (H) with 1 KOe is applied to a Faraday rotator having a length (t) of 1 mm, a laser beam in a wavelength range of about 400 nm to about 680 nm is irradiated to the Faraday rotator by a lamp-coat spectroscopic device. The magnetic field is applied substantially parallel to the laser beam, and the Faraday rotational angle (θ) of the exited light is measured. The Verdet constant is determined by substituting the Faraday rotational angle (θ) for (θ) in an equation of $V=\theta/(t \times H)$. Table 1 shows the results.

Figure 4:
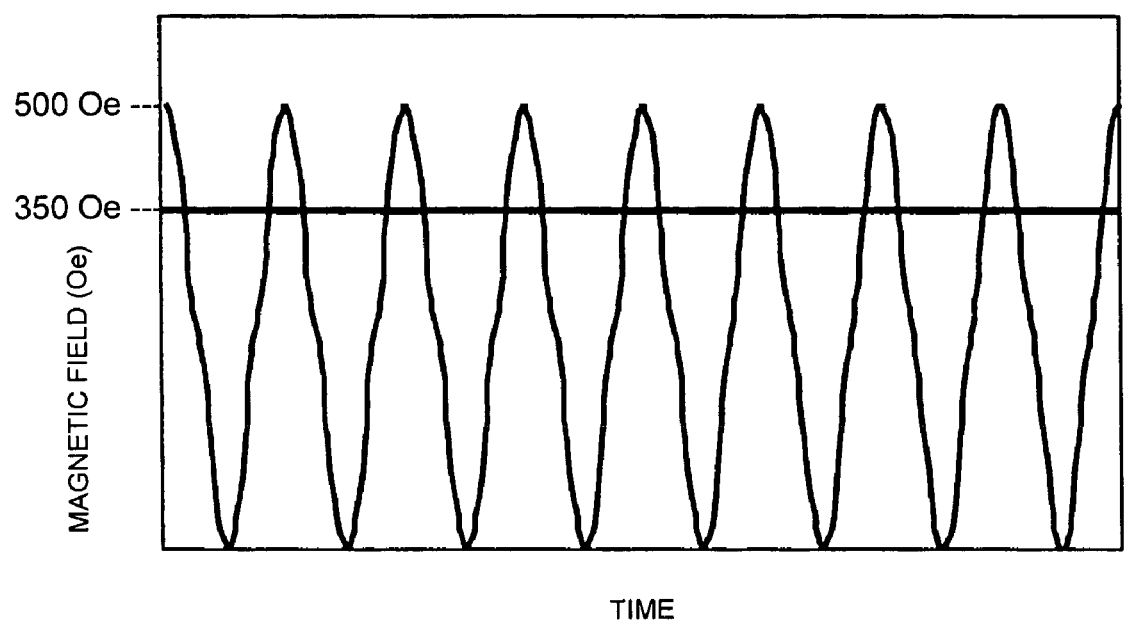
FIG. 4 is a graph showing a magnetic field-time characteristic of the photo magnetic field sensors of Examples 1 to 3 and Comparative Examples 1 to 3.

Then, the magnetic field variation for the photo magnetic field sensors of Examples 1 to 3 and Comparative Examples 1 to 3 is measured. First, an impeller having a magnet disposed on the top thereof is set on the side of the Faraday rotator of each photo magnetic field sensor. The magnetic field is varied by rotating the impeller with a motor. FIG. 4 shows the variation of the magnetic field. Moreover, a laser beam is irradiated to each photo magnetic field sensor by means of an He—Ne laser (wavelength of about 633 nm). Then, the change of the quantity of a light exited from the Faraday rotator, caused by the variation of the magnetic field, is measured with a photodetector. FIGS. 5 to 10 show the changes of the light quantities for Examples 1 to 3 and Comparative Examples 1 to 3, respectively.

As shown in Table 1, the photo magnetic field sensors of Examples 1 to 3 have a high Verdet constant in a visible light region of about 525 nm to about 680 nm. Especially, the Verdet constants of Examples 2 and 3 are high in which Tb sites of the TAG single crystals are substituted by Ce or Pr. Moreover, it is seen that the photo magnetic field sensors of Examples 1 and 3 can sufficiently function in a visible light region of about 400 nm to 500 nm. On the other hand, with the photo magnetic field sensor of Comparative Example 1, the Faraday rotational angle can not be measured, since the irradiated light in a wavelength range of about 400 nm to about 650 nm is absorbed in the YIG single crystal. Moreover, for the photo magnetic field sensor of Comparative Example 2, the Verdet constant is about a half of that obtained with the photo magnetic field sensor of Example 1. The Verdet constant of the photo magnetic field sensor of Comparative Example 3 is only about 70% of that for Example 1.

Figure 5:
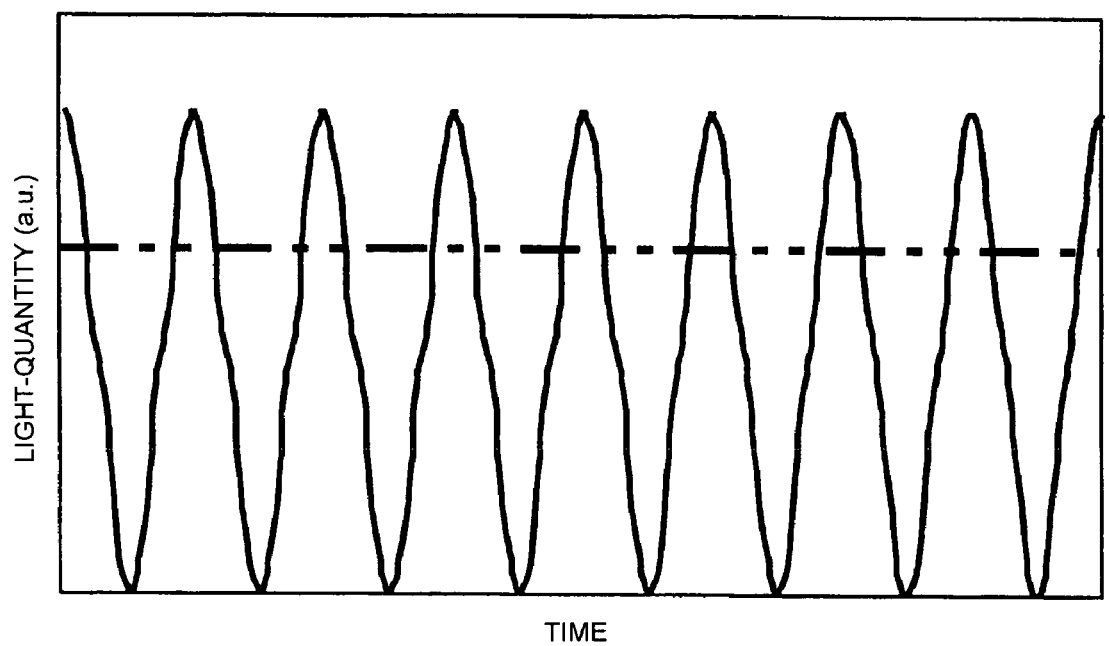
FIG. 5 is a graph showing a light-quantity-time characteristic of the photo magnetic field sensor of Example 1.
Figure 6:
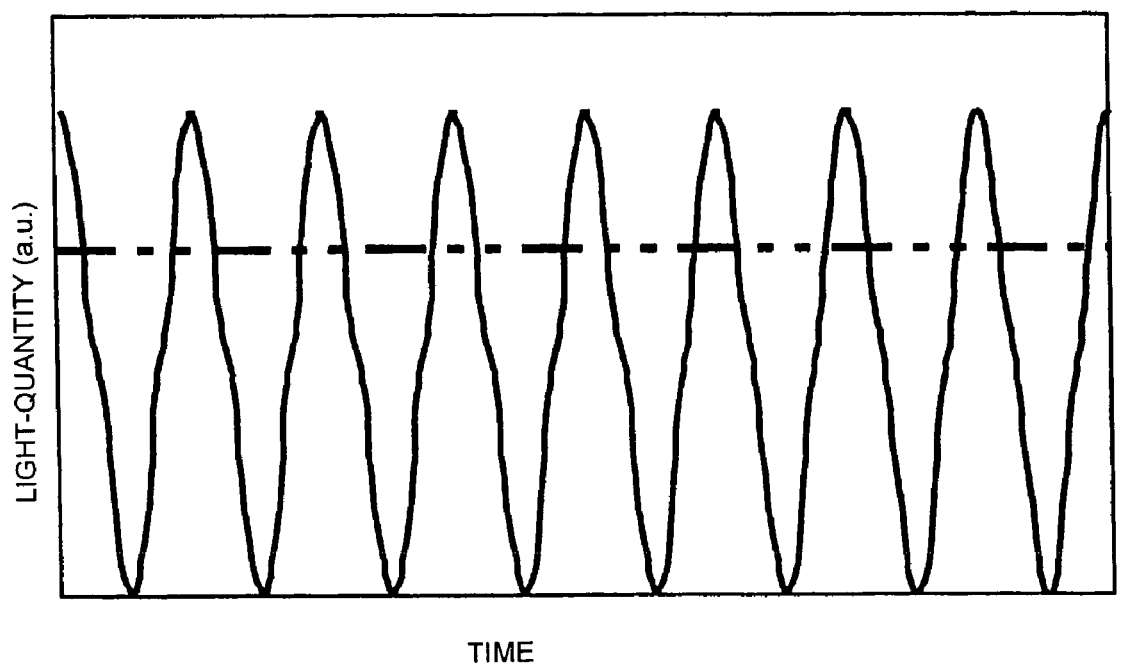
FIG. 6 is a graph showing a light-quantity-time characteristic of the photo magnetic field sensor of Example 2.
Figure 7:
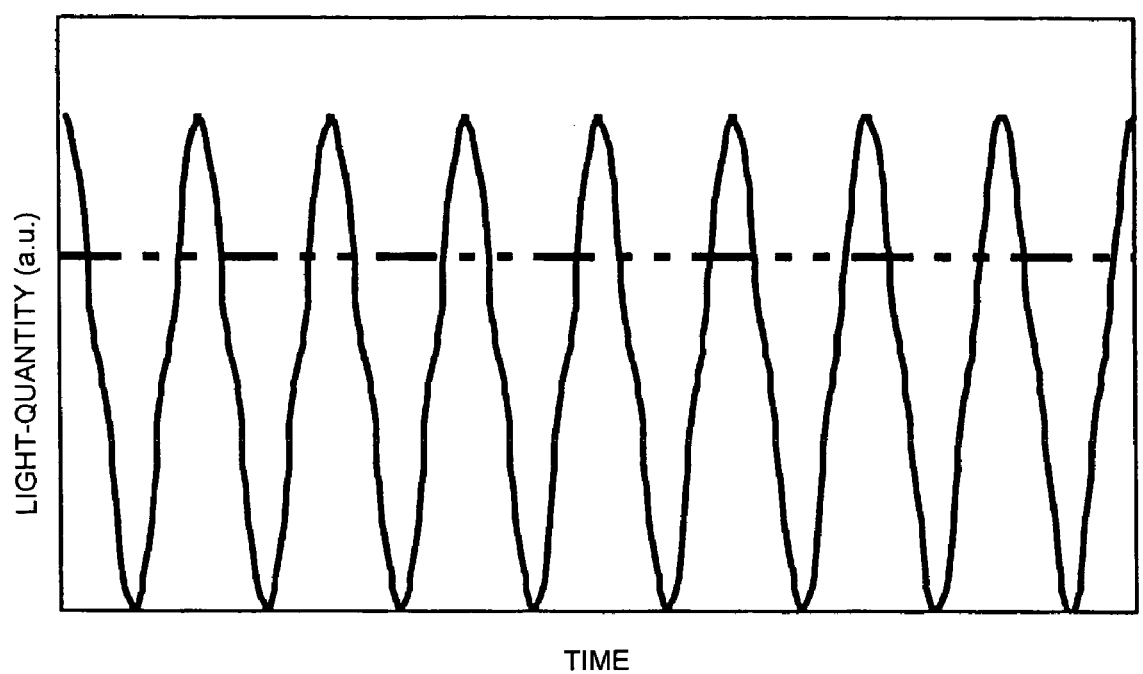
FIG. 7 is a graph showing a light-quantity-time characteristic of the photo magnetic field sensor of Example 3.
Figure 8:
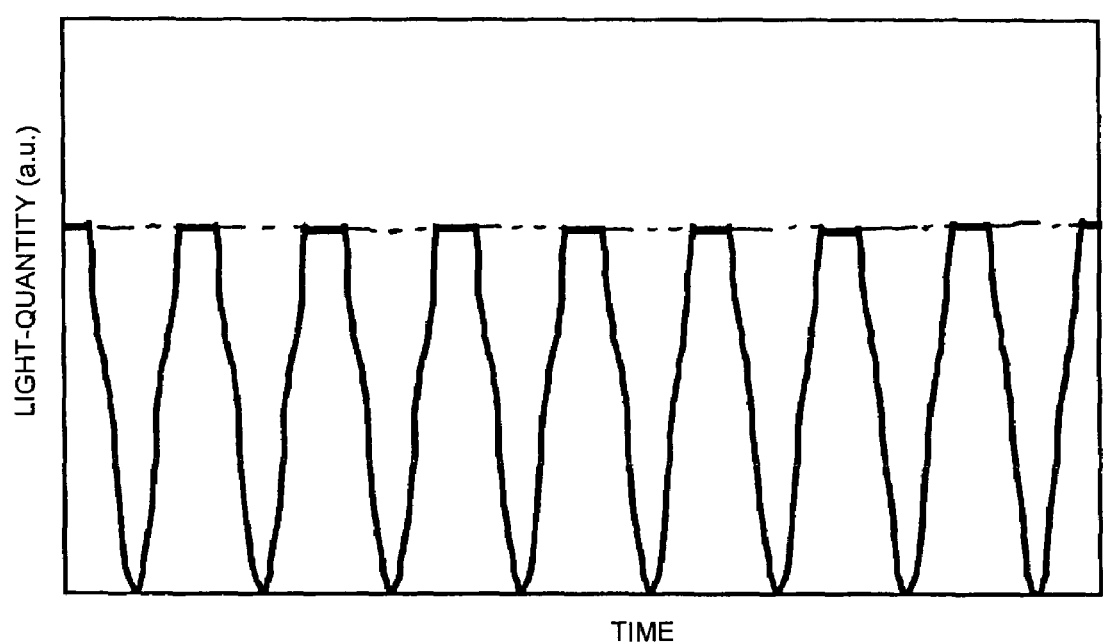
FIG. 8 is a graph showing a light-quantity-time characteristic of the photo magnetic field sensor of Comparative Example 1.
Figure 9:
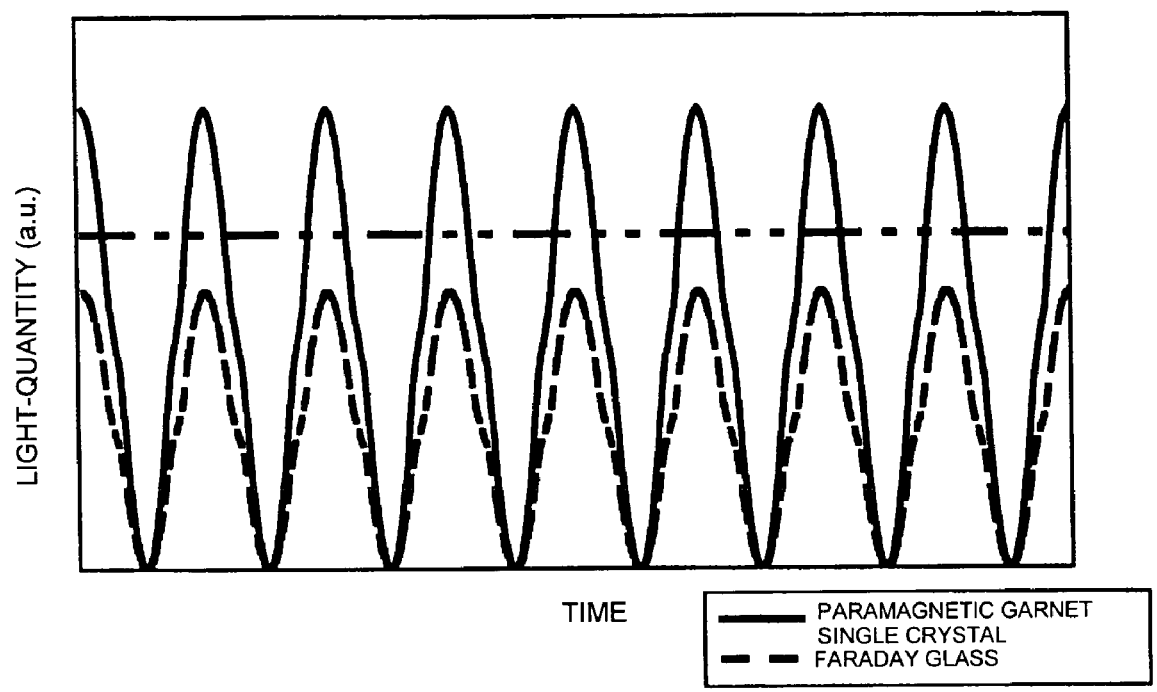
FIG. 9 is a graph showing a light-quantity-time characteristic of the photo magnetic field sensor of Comparative Example 2.
Figure 10:
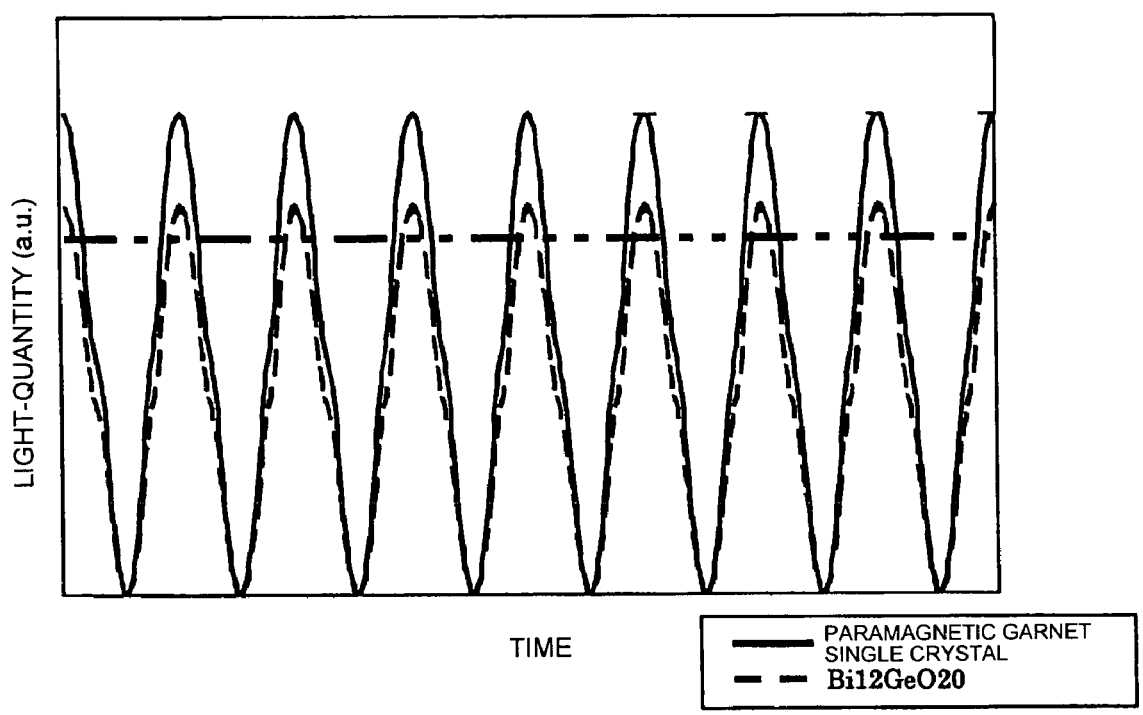
FIG. 10 is a graph showing a light-quantity-time characteristic of the photo magnetic field sensor of Comparative Example 3.

Referring to FIG. 4 showing the variation of the magnetic field, and FIG. 5 showing the light quantity detected with the photo magnetic field sensor of Example 1, the curve representing the magnetization variation applied to the Faraday rotator and the curve representing the light quantity detected with the photodetector have the same waveforms. This reveals that all of the magnetic field variations are converted to the light-quantities with no loss. The photo magnetic field sensor of Example 1 has a high Verdet constant, and the difference between the light-quantities is large. This shows that the sensitivity of the photo magnetic field sensor is high. For the photo magnetic field sensor of Example 2 shown in FIG. 6 and that of Example 3 shown in FIG. 7, the difference between the light-quantities is large as well as that of Example 1. Thus, the sensitivities of the photo magnetic field sensors are high. Regarding the photo magnetic field sensor of Comparative Example 1 shown in FIG. 8, when the magnetic field strength exceeds about 350 Oe, the Faraday rotational angle becomes constant due to the magnetic saturation. Thus, when the magnetic field strength is higher than about 350 Oe, the light-quantity is constant. In the photo magnetic field sensor of Comparative Example 2 shown in FIG. 9 and that of Comparative Example 3 shown in FIG. 10, paramagnetic materials are preferably used for the Faraday rotators. However, the performances as the photo magnetic sensors are inferior, since the light-quantities caused by the magnetic field variation are small.

It should be noted that in Example 1, affects of the demagnetizing field are suppressed, since the diameter of the end surface of the columnar Faraday rotator is preferably about 1 mm and the length between one end of the Faraday rotator and the other end thereof is preferably about 1 mm.

| Wavelength (nm) | Verdet constant V(degree $Oe^{-1}$ $cm^{-1}$) | | | | | |
| --- | --- | --- | --- | --- | --- | --- |
| | Example 1 | Example 2 | Example 3 | Comparative Example 1 | Comparative Example 2 | Comparative Example 3 |
| 400 | 0.035 | — | 0.018 | — | 0.017 | 0.026 |
| 405 | 0.033 | — | 0.016 | — | 0.016 | 0.023 |
| 410 | 0.032 | — | 0.032 | — | 0.015 | 0.022 |
| 420 | 0.030 | — | 0.031 | — | 0.014 | 0.021 |
| 525 | 0.022 | 0.025 | 0.027 | — | 0.011 | 0.016 |
| 575 | 0.018 | 0.021 | 0.023 | — | 0.009 | 0.013 |
| 633 | 0.010 | 0.0012 | 0.014 | — | 0.005 | 0.007 |
| 680 | 0.008 | 0.009 | 0.010 | — | 0.004 | 0.006 |

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

What is claimed is:

1. A photo magnetic field sensor comprising:
a Faraday rotator including a paramagnetic material, a polarizer, an analyzer, a light-irradiating element, and a light-sensing element; wherein
the paramagnetic material is made of a paramagnetic garnet single crystal consisting essentially of an oxide of Tb, and Al and at least one of Pr and Ce.

2. A photo magnetic field sensor according to claim 1, wherein the analyzer is arranged on an emergence side of the Faraday rotator and along an optical axis substantially parallel to the Faraday rotator.

3. A photo magnetic field sensor according to claim 1, wherein the polarizer is provided on an incidence side of the Faraday rotator.

4. A photo magnetic field sensor according to claim 1, wherein the polarizer and the analyzer are arranged such that an optical axis extended through the Faraday rotator passes through the polarization planes of the polarizer and the analyzer.

5. A photo magnetic field sensor according to claim 1, wherein the light-irradiating element is arranged such that light falls on the polarizer.

6. A photo magnetic field sensor according to claim 1, wherein a first total reflecting mirror is provided between the light-irradiating element and the polarizer.

7. A photo magnetic field sensor according to claim 6, wherein a second total reflecting mirror is provided between the analyzer and the light-sensing element.

8. A photo magnetic field sensor according to claim 7, wherein collective lenses are provided between the first total reflecting mirror and the polarizer and between the second total reflecting mirror and the analyzer, respectively.

9. A photo magnetic field sensor comprising:
a Faraday rotator including a paramagnetic material, a polarizer, an analyzer, a light-irradiating element, and a light-sensing element; wherein
the paramagnetic material has a columnar shape in which a diameter A in mm of the column of the Faraday rotator and a distance B in mm between one end of the Faraday rotator and the other end thereof satisfies $0 < A \leq 2$ and $1 \leq B/A \leq 10$; and
the paramagnetic material is made of a paramaganetic single crystal consisting essentially of an oxide of Tb, Al and at least one of Pr and Ce.

10. A photo magnetic field sensor according to claim 9, wherein the analyzer is arranged on an emergence side of the paramagnetic material and along an optical axis substantially parallel to the paramagnetic material.

11. A photo magnetic field sensor according to claim 9, wherein the polarizer is provided on an incidence side of the paramagnetic material.

12. A photo magnetic field sensor according to claim 9, wherein the polarizer and the analyzer are arranged such that an optical axis extended through the Faraday rotator passes through the polarization planes of the polarizer and the analyzer.

13. A photo magnetic field sensor according to claim 9, wherein the light-irradiating element is arranged such that light falls on the polarizer.

14. A photo magnetic field sensor according to claim 9, wherein a first total reflecting mirror is provided between the light-irradiating element and the polarizer.

15. A photo magnetic field sensor according to claim 14, wherein a second total reflecting mirror is provided between the analyzer and the light-sensing element.

16. A photo magnetic field sensor according to claim 15, wherein collective lenses are provided between the first total reflecting mirror and the polarizer and between the second total reflecting mirror and the analyzer, respectively.

* * * * *